US012199208B1

(12) United States Patent
Jin et al.

(10) Patent No.: US 12,199,208 B1
(45) Date of Patent: Jan. 14, 2025

(54) METHOD FOR WELDING CELL STRINGS AND SERIES WELDING MACHINE

(71) Applicants: JINKO SOLAR CO., LTD., Jiangxi (CN); ZHEJIANG JINKO SOLAR CO., LTD., Zhejiang (CN)

(72) Inventors: Hao Jin, Jiangxi (CN); Dongdong Sun, Jiangxi (CN); Niannian Qin, Jiangxi (CN); Jingguo Yang, Jiangxi (CN); Luchuang Wang, Jiangxi (CN); Wusong Tao, Jiangxi (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/496,652

(22) Filed: Oct. 27, 2023

(30) Foreign Application Priority Data

Aug. 9, 2023 (CN) .......................... 202311001256.X

(51) Int. Cl.
*B23K 31/00* (2006.01)
*B23K 31/12* (2006.01)
(Continued)

(52) U.S. Cl.
CPC ........ *H01L 31/0516* (2013.01); *B23K 31/125* (2013.01); *H01L 22/22* (2013.01); *H01L 31/1876* (2013.01)

(58) Field of Classification Search
CPC . H01L 31/0516; H01L 22/22; H01L 31/1876; B23K 1/0016; B23K 1/0008; B23K 31/125

(Continued)

(56) References Cited

U.S. PATENT DOCUMENTS 5,842,274 A * 12/1998 Modl ................... H05K 3/3485
228/56.3
8,636,198 B1 * 1/2014 Linderman ............ B23K 1/012
228/248.1

(Continued)

FOREIGN PATENT DOCUMENTS

CN 111185687 A 5/2020
CN 111211552 A * 5/2020
(Continued)

OTHER PUBLICATIONS

JINKO SOLAR CO., LTD., et al., Extended European Search Report, EP 232063876, Apr. 2, 2024, 9 pgs
(Continued)

*Primary Examiner* — Kiley S Stoner
(74) *Attorney, Agent, or Firm* — USCH Law, PC

(57) ABSTRACT

Embodiments of the present disclosure provide a method for welding cell strings and a series welding machine. The method includes: forming an arrangement of a plurality of solar cells; inspecting the arrangement of the plurality of solar cells; providing a plurality of initial welding strips including first initial welding strips and second initial welding strips, the first initial welding strips interleave with the second initial welding strips in a first direction; cutting each of the first initial welding strips at first cutting positions, and cutting each of the second initial welding strips at second cutting positions, to obtain a plurality of welding strips; moving each welding strip in a second direction to form a set of welding strips; transferring the set of welding strips onto the arrangement of the plurality of solar cells; and welding the plurality of welding strips to corresponding solar cells to form a cell string.

19 Claims, 7 Drawing Sheets

(51) Int. Cl.
*H01L 21/66* (2006.01)
*H01L 31/05* (2014.01)
*H01L 31/18* (2006.01)

(58) Field of Classification Search
USPC .............. 228/102–105, 8–12, 179.1–180.22
See application file for complete search history.

(56) References Cited

U.S. PATENT DOCUMENTS

| | | | | |
|---|---|---|---|---|
| 2015/0155398 | A1* | 6/2015 | Moslehi | H01L 31/0516 136/244 |
| 2015/0349190 | A1* | 12/2015 | Morad | H02S 40/36 438/59 |
| 2019/0312166 | A1* | 10/2019 | Lu | H01L 31/0682 |

FOREIGN PATENT DOCUMENTS

| | | | | | |
|---|---|---|---|---|---|
| CN | 113314636 | A | | 8/2021 | |
| CN | 113314637 | A | | 8/2021 | |
| CN | 216145634 | U | | 3/2022 | |
| CN | 114447158 | A | | 5/2022 | |
| CN | 114420782 | B | | 8/2022 | |
| CN | 114978031 | A | * | 8/2022 | |
| CN | 115274930 | A | * | 11/2022 | |
| CN | 115632090 | A | * | 1/2023 | |
| CN | 218570193 | U | * | 3/2023 | |
| CN | 116110994 | A | * | 5/2023 | |
| CN | 116469957 | A | | 7/2023 | |
| CN | 116469961 | A | | 7/2023 | |
| CN | 116944724 | A | * | 10/2023 | |
| EP | 2704213 | A1 | * | 3/2014 | ......... H01L 31/0508 |
| EP | 4156310 | A1 | | 3/2023 | |
| JP | 2008053625 | A | * | 3/2008 | ........... B23K 1/0008 |
| JP | 2016525791 | A | | 8/2016 | |
| JP | 2017220965 | A | * | 12/2017 | |
| JP | 2018153010 | A | * | 9/2018 | |
| JP | 2021501548 | A | * | 1/2021 | |
| JP | 2021170639 | A | | 10/2021 | |
| KR | 101014750 | B1 | | 2/2011 | |
| WO | WO-2012073836 | A1 | * | 6/2012 | ........... G01R 31/025 |
| WO | WO-2016134356 | A1 | * | 8/2016 | ............ H01H 85/05 |
| WO | 2017043518 | A1 | | 3/2017 | |
| WO | 2022199881 | A2 | | 9/2022 | |

OTHER PUBLICATIONS

JINKO SOLAR CO., LTD., et al., Examination report No. 1 for standard patent application, AU 2023258331, Sep. 11, 2024, 7 pgs.

* cited by examiner

METHOD FOR WELDING CELL STRINGS AND SERIES WELDING MACHINE

CROSS REFERENCE TO RELATED APPLICATIONS

The present application claims the benefit of priority under the Paris Convention to Chinese Patent Application No. 202311001256.X filed on Aug. 9, 2023, which is incorporated herein by reference in its entirety.

TECHNICAL FIELD

Embodiments of the present disclosure relate to the field of photovoltaics, and in particular to a method for welding cell strings and a series welding machine.

BACKGROUND

An interdigitated back-contact (IBC) solar cell refers to a solar cell having a structure in which positive and negative metal electrodes are formed in an interdigitated pattern on a back surface of the solar cell and are in contact with junctions formed on the back surface. The PN junctions and the electrodes of this solar cell are disposed on the back surface of the solar cell, i.e. the electrodes for emission regions and base regions of the IBC cell are all formed on the back surface, and there are no gird lines on a front surface. In this way, the performance of photoelectric conversion of the solar cell can be improved.

IBC cells may be series welded into a cell string in a following way: the cells are arranged in sequence with back surfaces facing upwards, and each two adjacent cells have opposite polarities. Then a plurality of cells are welded using a set of interdigitated welding strips to obtain the cell string. However, some welding strips of the set of interdigitated welding strips are highly likely to be bent, and the welding strips are prone to deformation, thereby leading to deviation in welding.

SUMMARY

Embodiments of the present disclosure provide a method for welding cell strings and a series welding machine, which are at least conducive to address the problems of welding strips being bent and deviation in welding.

Some embodiments of the present disclosure provide a method for welding a cell string, including:
providing a plurality of solar cells and forming an arrangement of the plurality of solar cells;
performing inspections on the arrangement of the plurality of solar cells, wherein the inspections include polarity inspections, in response to the polarity inspections not passing, adjusting the arrangement of the plurality of solar cells until the polarity inspections on an adjusted arrangement of the plurality of solar cells pass;
in response to the polarity inspections on the adjusted arrangement of the plurality of solar cells passing:
placing the adjusted arrangement of the plurality of solar cells on a welding table;
providing a plurality of initial welding strips arranged at intervals in a first direction, wherein each of the plurality of initial welding strips extends in a second direction, and wherein the plurality of initial welding strips include first initial welding strips and second initial welding strips, and the first initial welding strips interleave with the second initial welding strips in the first direction;
cutting each respective initial welding strip of the plurality of initial welding strips along the first direction to obtain a plurality of welding strips, wherein each of the first initial welding strips is cut at one or more first cutting positions, and each of the second initial welding strips is cut at one or more second cutting positions;
moving each welding strip of the plurality of welding strips in the second direction to form a set of welding strips having a spacing between each two adjacent welding strips of the plurality of welding strips in the second direction;
transferring the set of welding strips onto the adjusted arrangement of the plurality of solar cells such that each welding strip of the set of welding strips contacts with a peripheral solar cell of the adjusted arrangement of the plurality of solar cells or with two respective adjacent solar cells of the adjusted arrangement of the plurality of solar cells; and
welding each welding strip of the plurality of welding strips to the peripheral solar cell of the adjusted arrangement of the plurality of solar cells or to the two respective adjacent solar cells of the adjusted arrangement of the plurality of solar cells, to form a cell string.

In some embodiments, a distance between one respective first cutting position of the one or more first cutting positions and one respective second cutting position of the one or more second cutting positions adjacent to the one respective first cutting position in the second direction ranges from 50 mm to 110 mm.

In some embodiments, the spacing between each two adjacent welding strips of the plurality of welding strips in the second direction ranges from 8 mm to 15 mm.

In some embodiments, the inspections further include visual inspections, and in response to both the polarity inspections and the visual inspections passing, the inspections are passed. Performing the visual inspections on the arrangement of the plurality of solar cells, includes: performing a visual inspection on each respective solar cell of the adjusted arrangement of the plurality of solar cells; in response to the visual inspection of the each respective solar cell passing, determining that the visual inspections of the adjusted arrangement of the plurality of solar cells are passed; in response to the visual inspection of any one solar cell of the adjusted arrangement of the plurality of solar cells not passing, determining that the visual inspections of the adjusted arrangement of the plurality of solar cells are not passed, and replacing one or more solar cells whose visual inspections are not passed with new one or more solar cells, where each solar cell of the new one or more solar cells has a polarity same as a polarity of a respective solar cell of replaced one or more solar cells; and performing the visual inspections again, until the visual inspections on a replaced arrangement of the plurality of solar cells are passed.

In some embodiments, performing the polarity inspections on the arrangement of the plurality of solar cells, includes: performing a polarity inspection on each respective solar cell of the arrangement of the plurality of solar cells; in response to any two adjacent solar cells of the arrangement of the plurality of solar cells having different polarities, determining that the polarity inspections of the arrangement of the plurality of solar cells are passed; and in response to any two adjacent solar cells of the arrangement of the plurality of solar cells having a same polarity, determining that the polarity inspections of the arrangement of the plurality of solar cells are not passed, and removing one solar cell of each two adjacent solar cells of the arrangement of the plurality of solar cells having a same polarity.

In some embodiments, before transferring the set of welding strips onto the adjusted arrangement of the plurality of solar cells, the method further includes: providing a press tooling and placing the press tooling on the set of welding strips; and transferring the set of welding strips onto the adjusted arrangement of the plurality of solar cells, further includes: transferring the set of welding strips together with the press tooling onto the adjusted arrangement of the plurality of solar cells.

In some embodiments, the plurality of solar cells are back-contact solar cells.

Some embodiments of the present disclosure provide a series welding machine, including:
- a conveyor belt, configured to carry a plurality of solar cells, such that an arrangement of the plurality of solar cells is formed;
- an inspection apparatus, configured to perform inspections on the arrangement of the plurality of solar cells, wherein the inspection apparatus includes a polarity inspection device configured to perform polarity inspections on the arrangement of the plurality of solar cells and adjust the arrangement of the plurality of solar cells in response to the polarity inspections not passing, until the polarity inspections on an adjusted arrangement of the plurality of solar cells pass;
- a welding mechanism, including a welding table and configured to weld the adjusted arrangement of the plurality of solar cells with a set of welding strips;
- a strip-providing mechanism, configured to provide a plurality of initial welding strips arranged at intervals in a first direction, wherein each of the plurality of initial welding strips extends in a second direction, and wherein the plurality of initial welding strips include first initial welding strips and second initial welding strips, and the first initial welding strips interleave with the second initial welding strips in the first direction;
- a cutting mechanism, configured to cut each respective initial welding strip of the plurality of initial welding strips along the first direction to obtain a plurality of welding strips, wherein the cutting mechanism includes:
  - a first cutting device, configured to cut each of the first initial welding strips at one or more first cutting positions; and
  - a second cutting device, configured to cut each of the second initial welding strips at one or more second cutting positions;
- a strip-separating mechanism, configured to move each welding strip of the plurality of welding strips in the second direction to form the set of welding strips having a spacing between each two adjacent welding strips of the plurality of welding strips in the second direction; and
- a transferring apparatus, configured to transfer the set of welding strips onto the adjusted arrangement of the plurality of solar cells, such that each welding strip of the set of welding strips contacts with a peripheral solar cell of the adjusted arrangement of the plurality of solar cells or with two respective adjacent solar cells of the adjusted arrangement of the plurality of solar cells.

In some embodiments, the transferring apparatus includes: a plurality of micro clips forming at least one set of micro clips, where micro clips of one respective set of micro clips of the at least one set of micro clips are arranged in a line along the second direction, and the plurality of micro clips are configured to clamp the plurality of welding strips for transferring the set of welding strips onto the adjusted arrangement of the plurality of solar cells.

In some embodiments, during transferring the set of welding strips onto the adjusted arrangement of the plurality of solar cells by the transferring apparatus, each welding strip of the set of welding strips are clamped and tensioned by at least two adjacent micro clips of a respective set of micro clips of the at least one set of micro clips.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations. In order to illustrate the technical solutions in related technologies or in the embodiments of the present disclosure more clearly, the drawings to be used in the description of the embodiments will be briefly described below. It is obvious that the drawings mentioned in the following description are only some embodiments of the present disclosure. For those of ordinary skill in the art, other drawings may also be obtained in accordance with these drawings without any inventive effort.

DETAILED DESCRIPTION OF THE EMBODIMENTS

Figure 1:
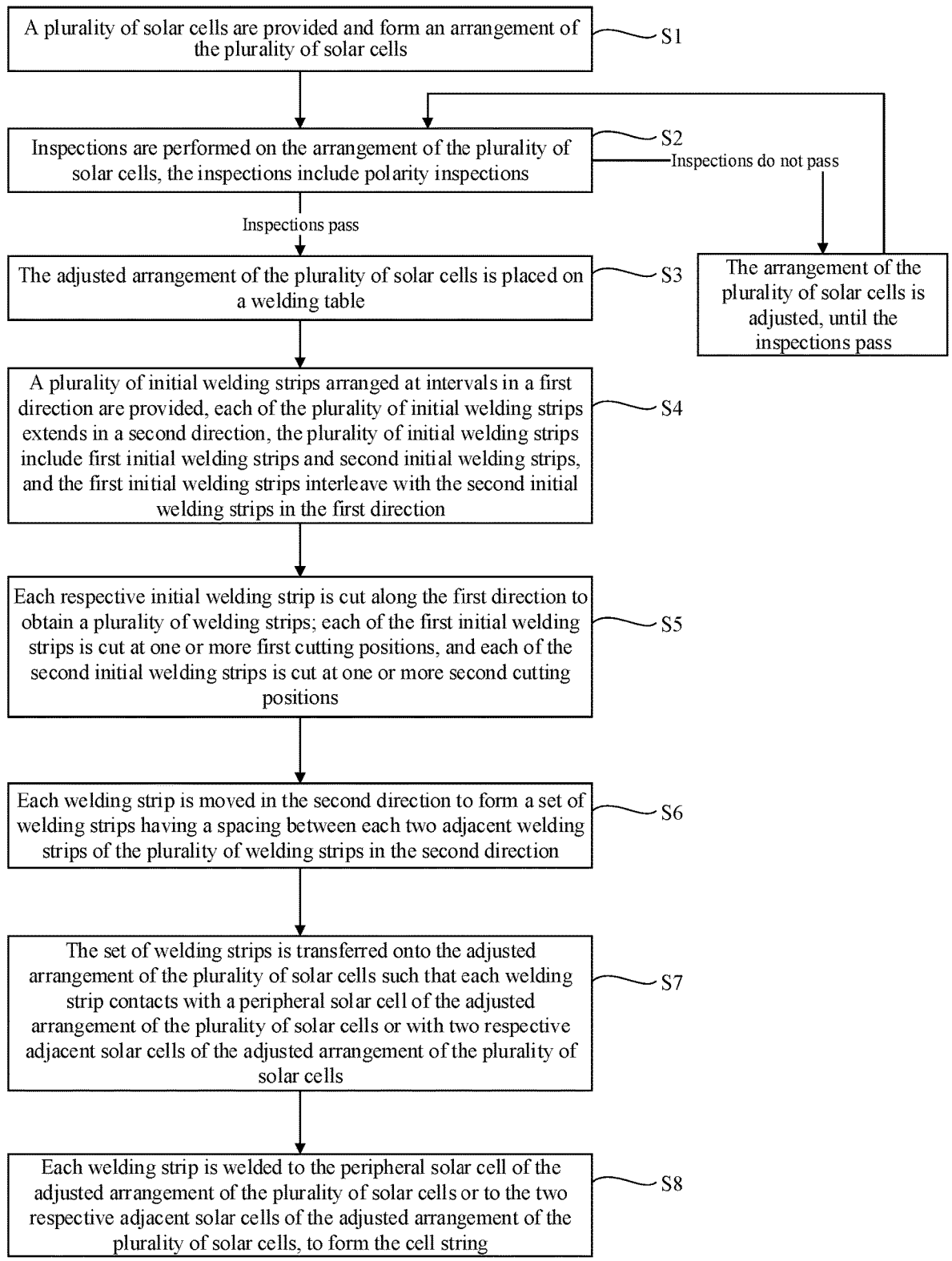
FIG. 1 is a flow chart of a method for welding cell strings according to some embodiments of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It can be known from the background art that the existing method for welding cell strings risks that welding strips are likely to be bent, leading to deviation in welding.

In related technologies, during arranging welding strips, a drawing apparatus for welding strips is used to draw a plurality of welding strips in an interdigitated manner. Firstly, a plurality of welding strips spaced from each other are arranged in corresponding positions, and then are laid on solar cells. Secondly, a plurality of remaining welding strips are drawn and arranged in corresponding positions, and then are laid on the solar cells. Finally, the set of welding strips which is arranged in the interdigitated manner is welded to the arrangement of the plurality of solar cells to form a cell string. During the plurality of welding strips are drawn by the drawing apparatus for welding strips and are arranged in the interdigitated manner, due to the small widths and low hardness of the welding strips, the welding strips are very likely to be bent, resulting in deviations in welding of the welding strips in the obtained cell string.

In the embodiments of the present disclosure, on the one hand, all initial welding strips are cut and arranged concurrently to form the overall set of welding strips, without need of processing the initial welding strips singly, thereby improving production efficiency. On the other hand, during cutting of the plurality of initial welding strips, cutting positions of first initial welding strips are different from cutting positions of second initial welding strips of the plurality of initial welding strips. In other words, each two adjacent initial welding strips of the plurality of initial welding strips have different cutting positions. The cutting positions are adaptive to arrangement positions of welding strips to be determined in a subsequent arrangement process. Thus, cutting at suitable positions can reduce moving distance of each welding strip in the subsequent process, and can reduce strokes of the strip-separating mechanism. In this way, the risk of the welding strips being bent and the possibility of deviations in welding can be reduced. Moreover, in embodiments of the present disclosure, inspections are performed on solar cells during arrangement of the solar cells, thereby reducing the risk of defective solar cells and improving yield of products.

Some embodiments of the present disclosure provide a method for welding a cell string. A plurality of solar cells are arranged to form an arrangement of the plurality of solar cells, and inspections are performed on the arrangement of the plurality of solar cells. In response to the inspections passing, the arrangement of the plurality of solar cells is placed on a welding table. A plurality of initial welding strips are provided and cut, where each of first initial welding strips of the plurality of initial welding strips is cut at one or more first cutting positions, and each of second initial welding strips of the plurality of initial welding strips is cut at one or more second cutting positions that are offset from the one or more first cutting positions. Each welding strip of the plurality of welding strips obtained by cutting is moved to form a set of welding strip. The set of welding strips is transferred onto and welded with the arrangement of the plurality of solar cells to form a cell string. In this way, the initial welding strips arranged in the interdigitated manner are cut and arranged concurrently, thereby improving production efficiency. On the other hand, different initial welding strips are cut at different cutting positions, thereby reducing distances in the strip-separating process. In this way, the risk of the welding strips being bent and the possibility of deviations in welding can be reduced. Moreover, inspections performed on the arrangement of the plurality of solar cells can reduce the risk of defective solar cells and improve yield of products.

In order to make the purposes, technical solutions and advantages of the embodiments of the present disclosure more clearly, the embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Figure 2:
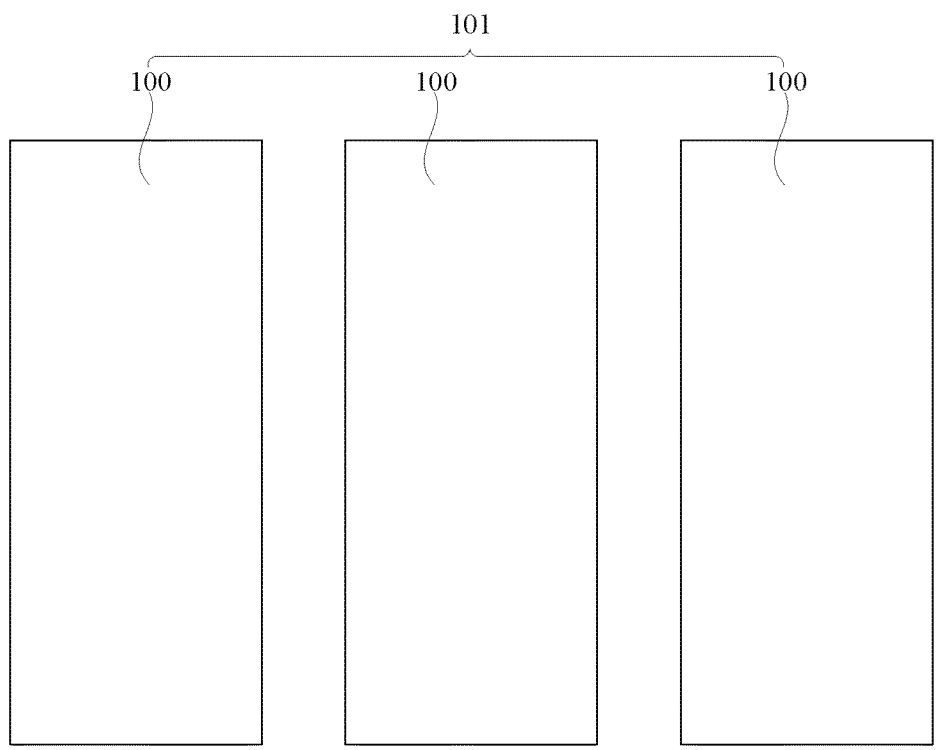
FIGS. 2 to 8 are structural schematic diagrams corresponding to operations of the method for welding cell strings according to some embodiments of the present disclosure.

Referring to FIGS. 1 and 2, at S1, a plurality of solar cells 100 are provided and form an arrangement of the plurality of solar cells 101.

In some embodiments, the provided plurality of solar cells 100 may be back-contact cells. The provided plurality of cells 100 may be interdigitated back contact (IBC) cells. Contact electrodes of an IBC cell which are in an interdigital form and contact with at least one P/N junction, a substrate, and at least one emitter region are formed on the back surface of the cell. A p+ region is formed by printing an interdigital diffusion mask layer containing boron on the back surface of the cell and by diffusion of the boron in the mask layer into the N-type substrate, and an n+ region is formed by diffusion of phosphorus in a region on which the mask layer is not printed. The grid lines of the IBC cell are all formed on the back surface of the cell, and there is no grid line on the front surface of the cell, which may eliminate the loss of current due to blocking of light by the metal electrodes and achieve maximum utilization of incident photons. Compared with conventional solar cells, the short-circuit current of an IBC cell may be increased by about 7%. Due to the back-contact structure of the IBC cells, there is no concern on blocking of gird lines, and scales of the gird lines may be appropriately increased to reduce series resistance. Moreover, surface passivation and surface trapping structures may be optimized, to obtain lower recombination rate on the front surface and lower surface reflection. Furthermore, the IBC cells have beautiful appearance, and are especially suitable for the integration of photovoltaic modules and buildings.

It can be known from above that during forming a cell string with back-contact cells, the welding strips used to connect the cells 100 are welded to the back surfaces of the cells 100. Moreover, during forming the arrangement of the plurality of solar cells 101, the arrangement of the plurality of solar cells 101 is arranged such that any two adjacent solar cells 100 of the arrangement of the plurality of solar cells 101 have opposite polarities. Herein, the expression "any two adjacent solar cells have opposite polarities" refers that the two solar cells are arranged such that a p+ region of one solar cell is adjacent to an n+ region of the other solar cell, or an n+ region of one solar cell is adjacent to a p+ region of the other solar cell. Similarly, the expression "any two adjacent solar cells have a same polarity" refers that the two solar cells are arranged such that the p+ region of one solar cell is adjacent to the p+ region of the other solar cell, or the n+ region of one solar cell is adjacent to the n+ region of the other solar cell.

It should be noted that FIG. 2 only shows three solar cells 100 of the arrangement of the plurality of solar cells 101, and is not intended to limit the number of solar cells 100 of an actual arrangement of the plurality of solar cells 101. In an actual production process, there may be a plurality of solar cells 100 in the arrangement of the plurality of solar cells 101.

Referring to FIGS. 1 and 2, at S2, inspections are performed on the arrangement of the plurality of solar cells 101, where the inspections include polarity inspections, in response to the polarity inspections not passing, the arrangement of the plurality of solar cells 101 is adjusted until the polarity inspections on an adjusted arrangement of the plurality of solar cells pass.

In some embodiments, performing the polarity inspections on the arrangement of the plurality of solar cells 101 may include: performing a polarity inspection on each respective solar cell 100 of the arrangement of the plurality of solar cells 101; in response to any two adjacent solar cells 100 of the arrangement of the plurality of solar cells having different polarities, determining that the polarity inspections of the arrangement of the plurality of solar cells are passed; and in response to any two adjacent solar cells 100 of the arrangement of the plurality of solar cells having a same polarity, determining that the polarity inspections of the arrangement of the plurality of solar cells are not passed, and removing one solar cell 100 of each two adjacent solar cells 100 of the arrangement of the plurality of solar cells having a same polarity. Any two adjacent solar cells 100 of the arrangement of the plurality of solar cells 101 whose polarity inspections pass have different polarities. In this way, a decrease in yield of the formed cell string due to the presence of adjacent solar cells 100 having a same polarity in the arrangement of the plurality of solar cells 101 can be prevented. When there are one or more polarity inspections which are not passed during the polarity inspections, it indicates that there are adjacent solar cells 100 having a same polarity. In this case, the arrangement of the plurality of solar cells 101 may be adjusted by removing one of the adjacent solar cells 100 having a same polarity.

The polarity inspections may include: a first solar cell 100 of the arrangement of the plurality of solar cells 101 is inspected to obtain a polarity of the first solar cell 100; a second solar cell 100 to be arranged is inspected to obtain a polarity of the second solar cell 100; it is determined whether the polarity of the first solar cell 100 is the same as the polarity of the second solar cell 100, in response to the polarity of the first solar cell 100 being the same as the polarity of the second solar cell 100, the second solar cell 100 is removed and a third solar cell 100 is taken as a new second solar cell 100, and the above inspections are repeated. In response to the polarity of the first solar cell 100 being not the same as the polarity of the second solar cell 100, a third solar cell 100 is inspected to obtain a polarity of the third solar cell 100, and it is determined whether the polarity of the third solar cell 100 is the same as the polarity of the second solar cell 100, until all solar cells 100 of the arrangement of the plurality of solar cells 101 are inspected. When the polarity inspections are completed and passed, any two adjacent solar cells 100 of the adjusted arrangement of the plurality of solar cells 101 have different polarities.

In some embodiments, performing inspections on the arrangement of the plurality of solar cells 101 may further include: performing visual inspections on the arrangement of the plurality of solar cells, and in response to both the polarity inspections and the visual inspections passing, the inspections are passed. It can be determined whether the solar cells 100 are defective, or whether there are scratches, cracks, and the like in the solar cells by the visual inspections. The visual inspections can ensure that each solar cell 100 of the arrangement of the plurality of solar cells 101 has high quality, thereby preventing the occurrence of substandard solar cells 100 in the arrangement of the plurality of solar cells 101, and effectively improving the yield of the formed cell string. In addition, the inspections performed on the arrangement of the plurality of solar cells 101 may further include other types of inspections, and only when all inspections pass, the inspections performed on the arrangement of the plurality of solar cells 101 pass. When any one inspection does not pass, the arrangement of the plurality of solar cells 101 shall be accordingly adjusted.

In some embodiments, performing the visual inspections on the arrangement of the plurality of solar cells 101 may include: performing a visual inspection on each respective solar cell 100 of the adjusted arrangement of the plurality of solar cells 101; in response to the visual inspection of the each respective solar cell 100 passing, determining that the visual inspections of the adjusted arrangement of the plurality of solar cells 101 are passed, and in response to the visual inspection of any one solar cell 100 of the adjusted arrangement of the plurality of solar cells not passing, determining that the visual inspections of the adjusted arrangement of the plurality of solar cells 101 are not passed; replacing one or more solar cells 100 whose visual inspections are not passed with new one or more solar cells 100, where each solar cell of the new one or more solar cells 100 has a polarity same as a polarity of a respective solar cell of replaced one or more solar cells 100; and performing the visual inspections again, until the visual inspections on a replaced arrangement of the plurality of solar cells 101 are passed. In this way, each solar cell 100 of the adjusted arrangement of the plurality of solar cells 101 can be subjected to a visual inspection, such that each solar cell 100 of the replaced arrangement of the plurality of solar cells 101 can be a qualified solar cell 100, thereby effectively improving the yield of the cell string. Any solar cell 100 whose visual inspection is not passed is replaced with a new solar cell 100, and the new solar cell 100 has a polarity same as a polarity of the replaced solar cell 100, in order to ensure that any two adjacent solar cells 100 of the replaced arrangement of the plurality of solar cells 101 still have opposite polarities.

Figure 3:
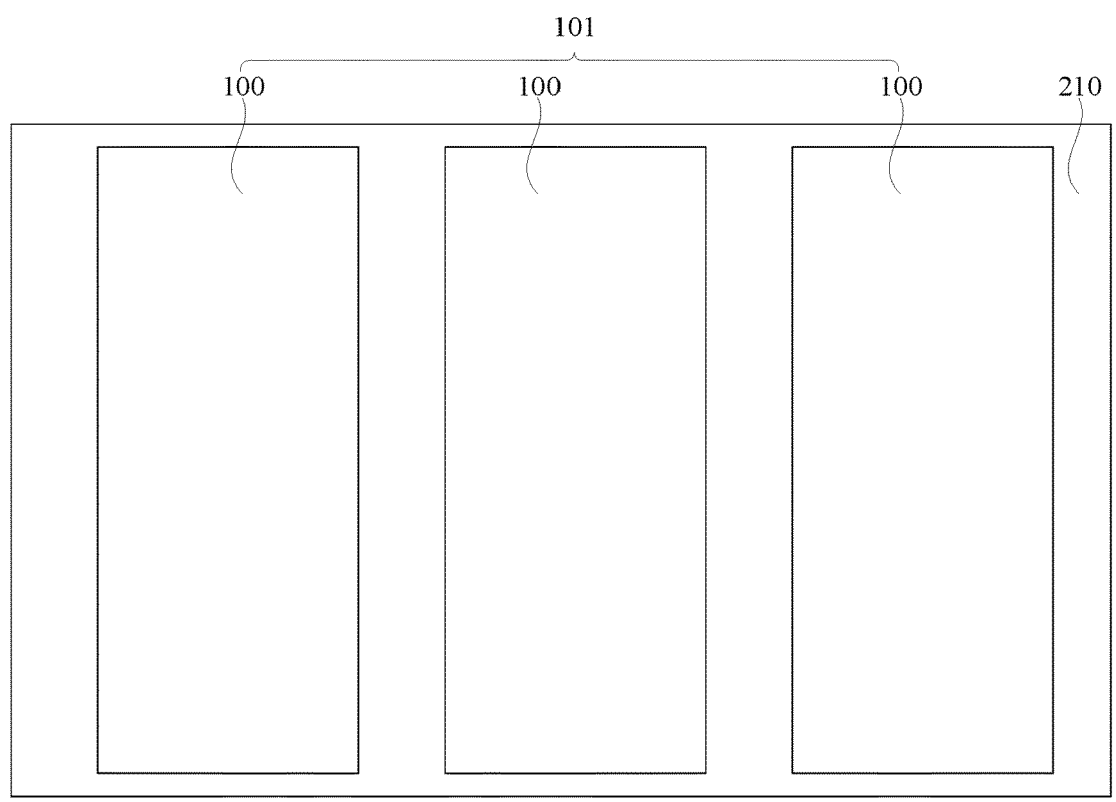

Referring to FIGS. 1 and 3, at S3, the adjusted arrangement of the plurality of solar cells 101 is placed on a welding table 210. The welding table 210 is an apparatus used for welding the adjusted arrangement of the plurality of solar cells 101 with welding strips. The arrangement of the plurality of solar cells 101 after adjustment and inspections may be placed on the welding table 210 for subsequent welding.

After the adjustment and placement of the arrangement of the plurality of solar cells 101, or during the adjustment and placement of the arrangement of the plurality of solar cells 101, the welding strips for welding the solar cells may be produced. Producing the welding strips during the adjustment and placement of the arrangement of the plurality of solar cells 101 can reduce production time and improve production efficiency.

Figure 4:
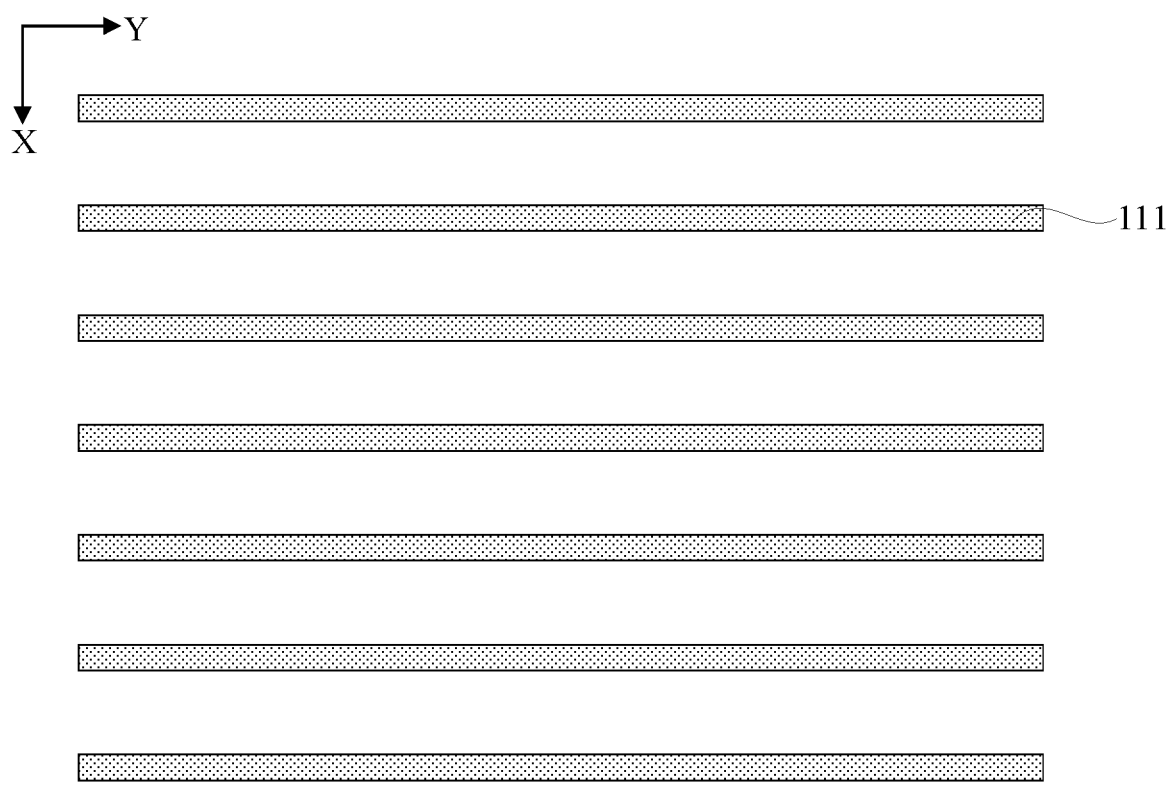

Referring to FIGS. 1 and 4, at S4, a plurality of initial welding strips 111 arranged at intervals in a first direction X are provided, where each of the plurality of initial welding strips 111 extends in a second direction Y, the plurality of initial welding strips 111 include first initial welding strips and second initial welding strips, and the first initial welding strips interleave with the second initial welding strips in the first direction X. After processing, an initial welding strip 111 may be transformed into a plurality of welding strips 110 in a same line along the second direction Y in the cell string. In the first direction X, a width of an initial welding strip 111 is the same as that of a welding strip 110 used in the cell string. Moreover, in the first direction X, a distance between adjacent initial welding strips 111 is the distance between adjacent welding strips 110 in the cell string. During producing the initial welding strips 111 into the welding strips 110, there is no need to move the welding strips 110 in the first direction X, which can reduce the risk of bending of the welding strips 110 due to movement of the welding strips 110.

Figure 5:
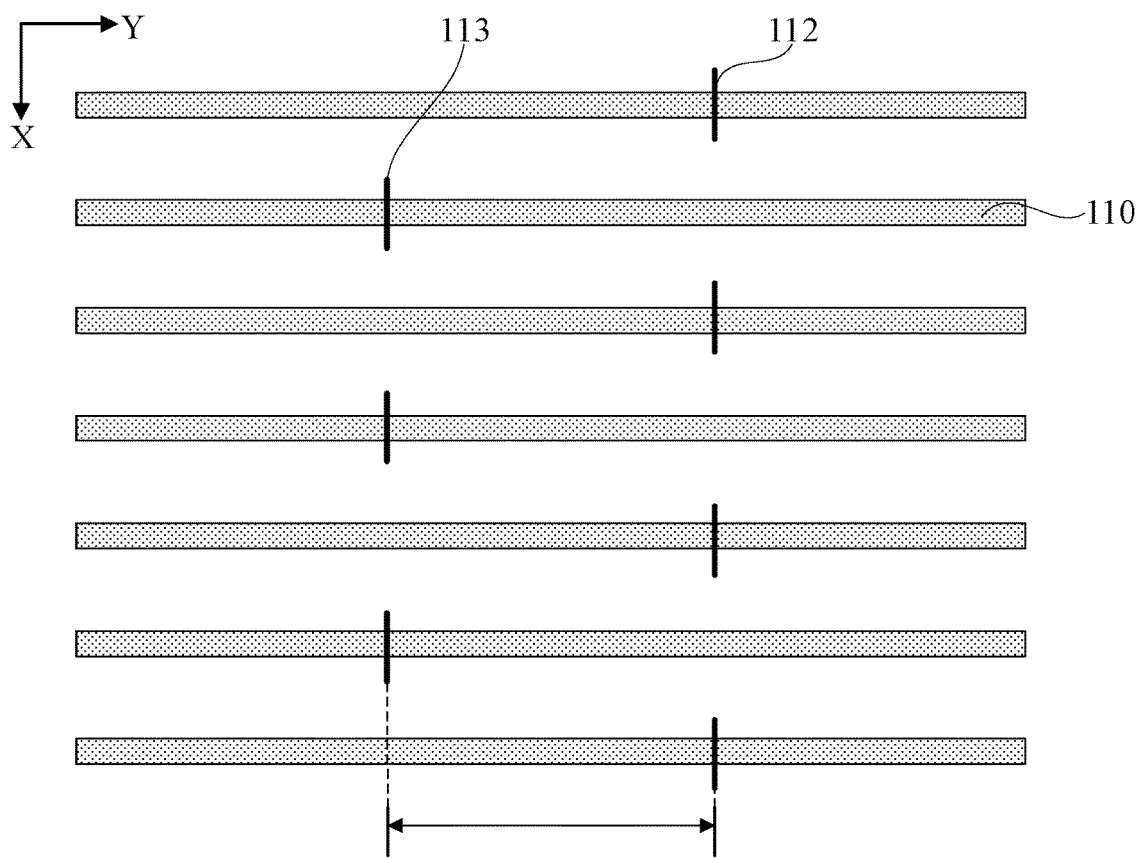

Referring to FIGS. 1 and 5, at S5, each respective initial welding strip of the plurality of initial welding strips 111 is cut along the first direction to obtain a plurality of welding strips 110. Each of the first initial welding strips 111 is cut at one or more first cutting positions 112, and each of the second initial welding strips 111 is cut at one or more second cutting positions 113 that are offset from the one or more first cutting positions 112.

In the cell string, the plurality of welding strips 110 which are used to connect the plurality of solar cells 100 to form the cell string are arranged in the interdigitated manner, in other words, the arrangement positions of the welding strips 110 located in adjacent lines in the first direction X are different, and the arrangement positions of the welding strips 110 located in each two lines separated in the first direction X and with another line between them are the same. Thus, in the first direction X, the first initial welding strips 111 of the plurality of initial welding strips have the same arrangement positions, and the second initial welding strips 111 of the plurality of initial welding strips have the same arrangement positions. Therefore, when cutting the plurality of initial welding strips 111 to obtain the plurality of welding strips 110, the first initial welding strips 111 and the second initial welding strips 111 may be cut at different cutting positions, and the cutting positions may be set according to the arrangement positions of the welding strips 111 in the cell string. In this way, during arrangement of the welding strips 110 obtained by cutting, moving distance of each welding strip can be effectively reduced, thereby reducing bending of the welding strips 110 occurred in strip-separating process, and reducing the risk of deviation in welding in the cell string.

In some embodiments, each first cutting position of the one or more first cutting positions 112 may align with a respective second cutting position of the one or more second cutting positions 113 in the first direction. In this way, the cutting mechanism for the initial welding strips 111 can be simplified to a certain extent, thereby reducing production costs.

Referring to FIG. 5, in some embodiments, the one or more first cutting positions 112 are different from the one or more second cutting positions 113, and a distance between one respective first cutting position of the one or more first cutting positions 112 and one respective second cutting position of the one or more second cutting positions 113 adjacent to the one respective first cutting position in the second direction Y ranges from 50 mm to 110 mm. For example, a distance between a first cutting position 112 and a second cutting position 113 adjacent to the first cutting position 112 in the second direction Y may be 50 mm, 70 mm, 90 mm, 100 mm, 110 mm, or the like. The distance between adjacent cutting positions is as shown in the drawing. If the distance between the first cutting position 112 and the second cutting position 113 adjacent to the first cutting position 112 in the second direction Y is too small, the welding strips 110 obtained by cutting the first initial welding strips 111 and/or the welding strips 110 obtained by cutting the second initial welding strips 111 have to be moved for relatively long distances to implement the interdigitated arrangement of the plurality of welding strips 110. Thus, the strip-separating distances are increased, thereby increasing the risk of bending of the welding strips 110 during the strip-separating process, and increasing the risk of deviation in welding in the formed cell string. If the distance between the first cutting position 112 and the second cutting position 113 adjacent to the first cutting position 112 in the second direction Y is too large, the welding strips 110 still have to be moved for relatively long distances to implement the interdigitated arrangement of the plurality of welding strips 110. Thus, the strip-separating distances are increased, thereby increasing the risk of bending of the welding strips 110 during the strip-separating process, and increasing the risk of deviation in welding in the formed cell string. Therefore, a suitable range of the distance between the first cutting position 112 and the second cutting position 113 adjacent to the first cutting position 112 in the second direction Y is selected, and the distance between adjacent cutting positions may be selected according to the arrangement of the welding strips 111 in the cell string. When the distance between the first cutting position 112 and the second cutting position 113 adjacent to the first cutting position 112 in the second direction Y ranges from 50 mm to 110 mm, moving distance of each welding strip 110 can be effectively reduced, thereby reducing risk of bending of the welding strips 110 during strip-separating process, and reducing the risk of deviation in welding in the formed cell string.

Figure 6:
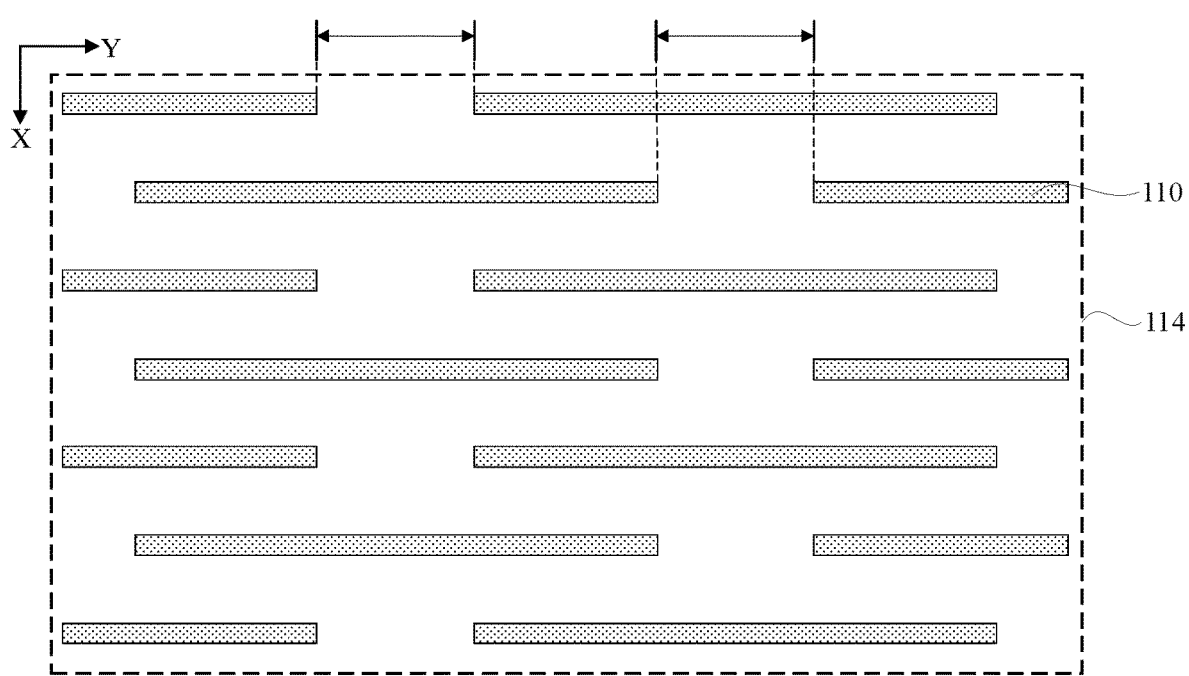

Referring to FIGS. 1 and 6, at S6, each welding strip 110 of the plurality of welding strips is moved in the second direction Y to form a set of welding strips 114 having a spacing between each two adjacent welding strips 110 of the plurality of welding strips in the second direction Y. The arrangement of the set of welding strips 114 refers to the arrangement of the plurality of welding strips 110 in the cell string 102. The positions of the plurality of welding strips 110 to be used in the cell string are arranged in advance, and the arranged set of welding strips 114 is transferred to the adjusted arrangement of the plurality of solar cells 101. In this way, moving distance of each welding strip 110 during the strip-separating process for interdigitated arrangement can be reduced, thereby reducing risk of bending of the welding strips 110.

Due to the fact that the distances between the plurality of initial welding strips 111 formed in the preceding operations in the first direction X are the same as the distances between adjacent welding strips 110 in the first direction X in the cell string, when moving the welding strips 110, the welding strips 110 are not moved in the first direction X, but only are moved in the second direction Y, which can reduce the risk of bending of the welding strips 110 during movement. Because during cutting of the welding strips 110, the welding strips 110 spaced from each other in the first direction X and having different arrangement positions in the cell string have different cutting positions, the moving distance of each welding strip 110 in the second direction Y can be reduced, thereby further reducing risk of bending of the welding strips 110 during movement, and reducing the risk of deviation in welding in the formed cell string.

Referring to FIG. 6, in some embodiments, after movement of each welding strips 110 in the second direction Y, the spacing between each two adjacent welding strips 110 of the plurality of welding strips in the second direction Y ranges from 8 mm to 15 mm. The spacing between two adjacent welding strips 110 in the second direction Y is shown in the drawing. For example, the spacing between two adjacent welding strips 110 in the second direction Y after movement may be 5 mm, 9 mm, 10 mm, 12 mm, 15 mm, and the like. The spacing between two adjacent welding strips 110 in the second direction Y after movement may be set according to the arrangement of the cell string. If the spacing between two adjacent welding strips 110 in the second direction Y is too small, then in the cell string formed by welding in subsequent operations, a spacing between adjacent solar cells 100 is small, and there is a risk of short circuit between adjacent solar cells 100, which will reduce the reliability of the cell string to a certain extent. If the spacing between two adjacent welding strips 110 in the second direction Y is too large, then in the cell string formed by welding in subsequent operations, the spacing between adjacent solar cells 100 is larger, and the overall size of the cell string is also larger, which will cause the size of the photovoltaic module made by the cell strings to be too large, thereby affecting the use of the product and causing material waste. Therefore, a suitable range of the spacing between two adjacent welding strips 110 in the second direction Y after movement is selected. When the spacing between two adjacent welding strips 110 in the second direction Y ranges from 8 mm to 15 mm, it will not cause a significant risk of short circuit in the cell string, nor cause a too large size of the cell string, thus no influence is brought to the use of the products.

In some embodiments, before transferring the set of welding strips 114 onto the adjusted arrangement of the plurality of solar cells 101, the method may further include: providing a press tooling (not shown in drawings) and placing the press tooling on the set of welding strips 114. The press tooling is a tooling apparatus and may be configured to press the set of welding strips 114 arranged in the preceding operations. Placing the press tooling on the set of welding strips 114 can press all the welding strips 110 of the set of welding strips 114 onto a same plane, which enables the welding strips 110 of the set of welding strips 114 to better contact with the surfaces of the solar cells 100 of the adjusted arrangement of the plurality of solar cells 101 after moving the set of welding strips 114 onto the adjusted arrangement of the plurality of solar cells 101, which is conducive to the subsequent welding operations.

Transferring the set of welding strips 114 onto the adjusted arrangement of the plurality of solar cells 101 may further includes: transferring the set of welding strips together with the press tooling onto the adjusted arrangement of the plurality of solar cells 101. The press tooling is configured to press all the welding strips 110 of the set of welding strips 114. Transferring the set of welding strips 114 together with the press tooling onto the adjusted arrangement of the plurality of solar cells 101 not only enables the welding strips 110 of the set of welding strips 114 to have better contact with the surfaces of the solar cells 100 of the adjusted arrangement of the plurality of solar cells 101, but also prevents the displacement of the arrangement of the welding strips 110 of the set of welding strips 114 during transferring the set of welding strips 114.

Figure 7:
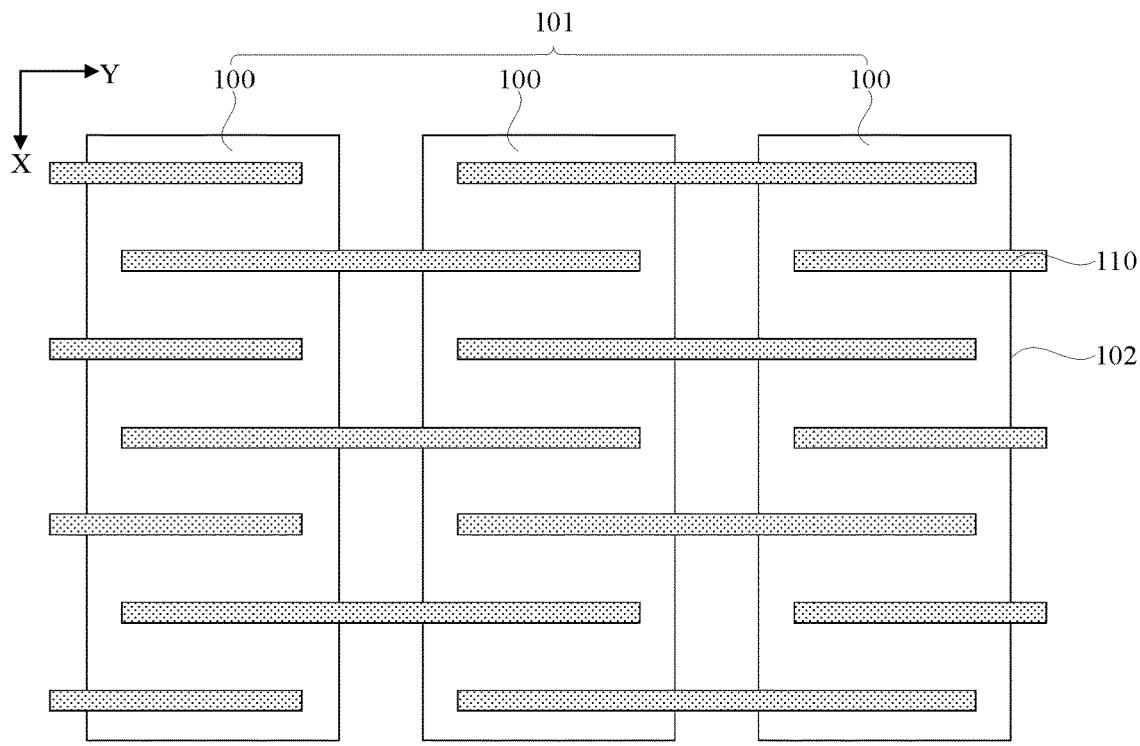

Referring to FIGS. 1 and 7, at S7, the set of welding strips 114 is transferred onto the adjusted arrangement of the plurality of solar cells 101 such that each welding strip 110 of the set of welding strips 114 contacts with a peripheral solar cell 100 of the adjusted arrangement of the plurality of solar cells or with two respective adjacent solar cells 100 of the adjusted arrangement of the plurality of solar cells. During transferring the set of welding strips 114 onto the adjusted arrangement of the plurality of solar cells 101, the relative position relationships among the welding strips 110 of the set of welding strips 114 do not change, and the relative position relationships among the welding strips 110 of the set of welding strips 114 which are in the interdigitated arrangement are formed only by the above strip-separating operation. The transferring process does not change the relative position relationships in the set of welding strips 114, nor cause bending of the welding strips 110 due to moving the welding strips 110 on a horizontal plane. Thus, the relative positions of the welding strips 110 are arranged first, and then the arranged set of welding strips 114 is transferred as a whole onto the adjusted arrangement of the plurality of solar cells 101, in this way, the moving distances of the welding strips 110 on the horizontal plane for the interdigitated arrangement can be effectively reduced, and the risk of the welding strips 110 being bent can be reduced.

Before transferring the set of welding strips 114, the adjusted arrangement of the plurality of solar cells 101 is disposed on the welding table 210. Thus, transferring the set of welding strips 114 onto the adjusted arrangement of the plurality of solar cells 101 means transferring the set of welding strips 114 onto the welding table 210 too, which facilitates the subsequent welding operation of welding the adjusted arrangement of the plurality of solar cells 101 with the set of welding strips 114 to form the cell string. After the set of welding strips 114 is transferred onto the adjusted arrangement of the plurality of solar cells 101, the welding strips 110 not located on peripheries of the set of welding strips in the second direction Y may connect two adjacent solar cells 100, and in the first direction X, each welding strip of the odd welding strips 110 connect two adjacent solar cells 100 different from those connected by each welding strip of the even welding strips 110. The welding strips 110 located on peripheries of the set of welding strips in the second direction Y may only connect to a peripheral solar cell 100. In addition, one end of one respective welding strip of the welding strips 110 located on peripheries of the set of welding strips in the second direction Y is connected to the peripheral solar cell 100, the other end of the one respective welding strip may extend outside the peripheral solar cell 100 for electrical connection with other structures.

In some embodiments, during transferring the set of welding strips 114, the welding strips 110 of the set of welding strips 114 may be tensioned. In this way, the possible deformation occurred during movement of the welding strips 110 for the interdigitated arrangement can be reduced, thereby further reducing the risk of the welding strips 110 being bent and the possibility of deviations in welding of the welding strips 110 in the cell string.

Referring to FIGS. 1 and 7, at S8, each welding strip 110 of the plurality of welding strips 110 is welded to the peripheral solar cell 100 of the adjusted arrangement of the plurality of solar cells 101 or to the two respective adjacent solar cells 100 of the adjusted arrangement of the plurality of solar cells 101, to form the cell string 102. The plurality of welding strips 110 can electrically connect with the adjusted arrangement of the plurality of solar cells 101, such that the adjusted arrangement of the plurality of solar cells 101 can formed the complete cell string 102. Compared with individual solar cell 100, the cell string 102 can achieve better power supply capacity and higher performance. Due to the fact that both the set of welding strips 114 and the adjusted arrangement of the plurality of solar cells 101 are located on the welding table 210, the welding table 210 may be directly used to weld the adjusted arrangement of the plurality of solar cells 101 and the set of welding strips 114.

It should be noted that the drawings only show a cell string 102 having three solar cells 100, which does not represent the actual number of the solar cells 100 of the cell string 102. In an actual cell string 102, there may be a plurality of solar cells 100.

Figure 8:
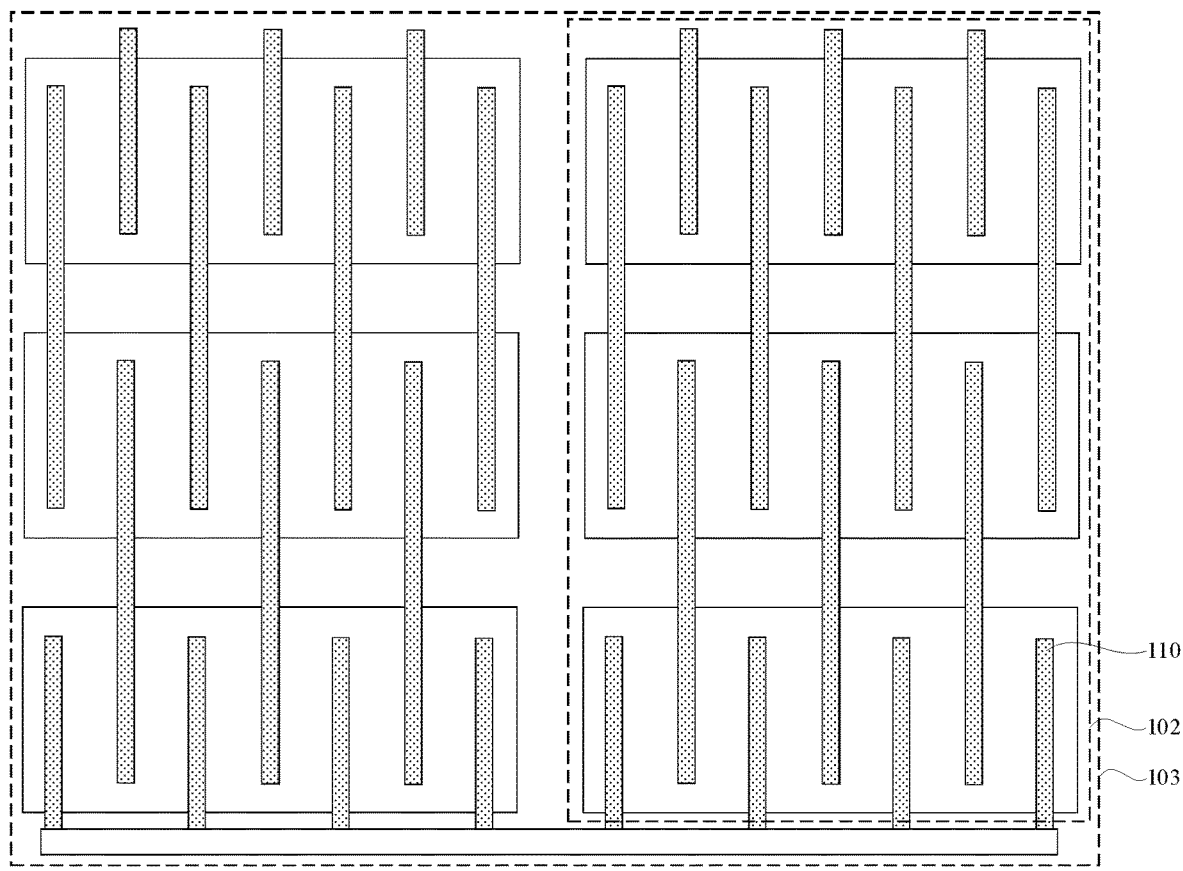

Referring to FIG. 8, after forming the cell string 102 by welding, a plurality of cell strings 102 may be connected to form a set of cell strings 103. The structures that connect the plurality of cell strings 102 may be bus bars. It should be noted that the drawings only show the set of cell strings 103 formed by connecting two cell strings 102, which does not represent the actual number of the cell strings 102 of the set of cell strings 103. In an actual set of cell strings 103, there may be a plurality of cell strings 102.

In some embodiments, connecting a plurality of cell strings 102 to form the set of cell strings 103 may include a connection method of AB strings, where A refers to a positive pole of a cell string 102, B refers to a negative pole of another cell string 102, and AB strings refer to connecting the positive pole to the negative pole. In this way, the output voltage and power of the set of cell strings 103 can be increased, and current loss can be reduced.

Some embodiments of the present disclosure provide a method for welding a cell string. A plurality of solar cells are provided and arranged to form an arrangement of the plurality of solar cells, and inspections are performed on the arrangement of the plurality of solar cells. In response to the inspections passing, the arrangement of the plurality of solar cells is placed on a welding table. A plurality of initial welding strips are provided and cut to obtain a plurality of welding strips, where each of first initial welding strips of the plurality of initial welding strips is cut at one or more first cutting positions, and each of second initial welding strips of the plurality of initial welding strips is cut at one or more second cutting positions that are offset from the one or more first cutting positions. Each welding strip of the plurality of welding strips is moved in the second direction to form a set of welding strips. The set of welding strips is transferred onto the arrangement of the plurality of solar cells and is welded to form the cell string. In this way, all welding strips are processed concurrently, thereby improving production efficiency. On the other hand, different initial welding strips are cut at different cutting positions, distances in the strip-separating process can be reduced, thereby reducing the risk of the welding strips being bent and the possibility of deviations in welding. Moreover, inspections are performed on the arrangement of the plurality of solar cells, thus the yield of products can be improved.

Some embodiments of the present disclosure provide a series welding machine applicable to implement the method for welding cell strings as described above. The following will provide a detailed description of the series welding machine provided by some embodiments of the present disclosure in conjunction with the accompanying drawings. The same or corresponding parts as the preceding embodiments may be referred to in the corresponding description of the aforementioned embodiments, and will not be described in detail below.

Figure 9:
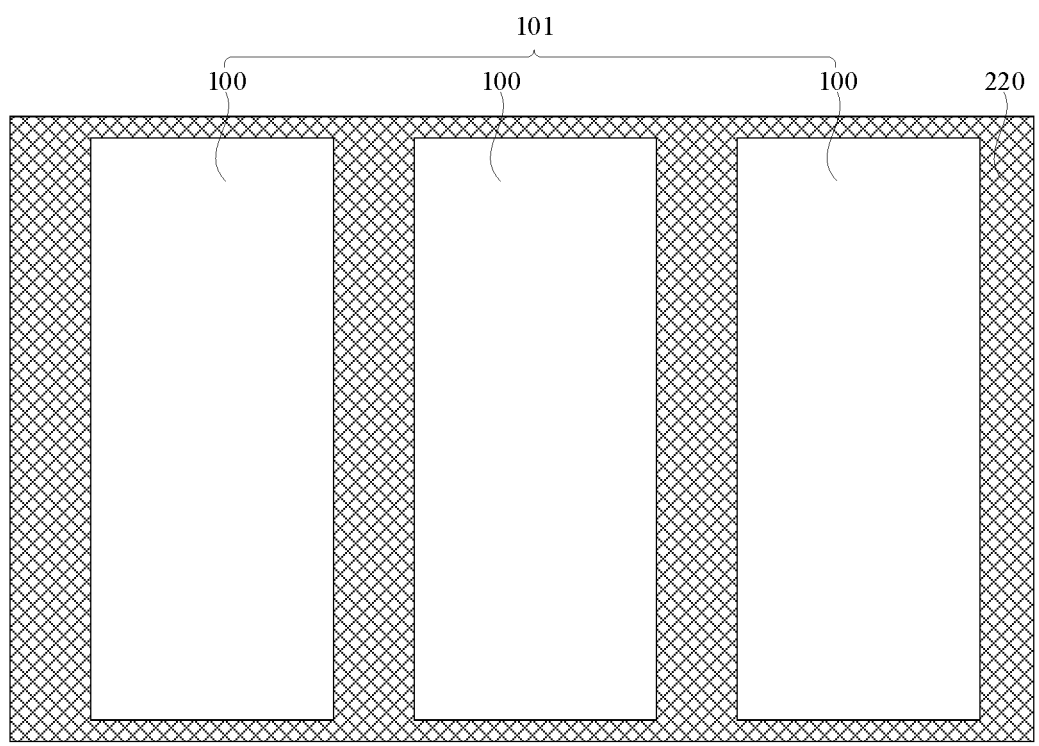
FIG. 9 is a structural schematic diagram of a conveyor belt of a series welding machine according to some embodiments of the present disclosure.
Figure 10:
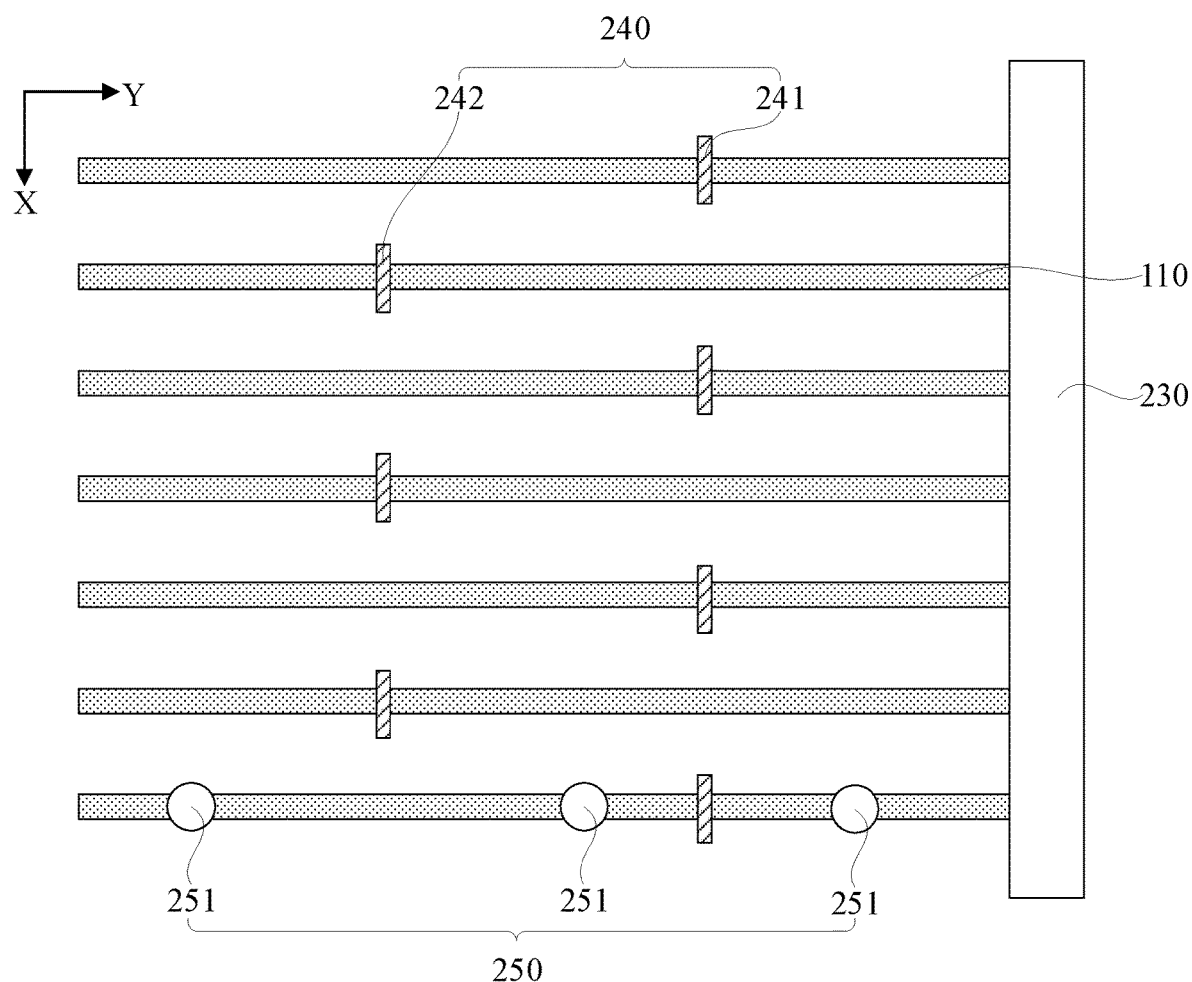
FIG. 10 is a structural schematic diagram of a strip-providing mechanism, a cutting mechanism and a transferring apparatus of the series welding machine according to some embodiments of the present disclosure.

FIG. 9 is a structural schematic diagram of a conveyor belt of the series welding machine with an arrangement of the plurality of solar cells being disposed on it according to some embodiments of the present disclosure. FIG. 10 is a structural schematic diagram of a strip-providing mechanism, a cutting mechanism and a transferring apparatus of the series welding machine according to some embodiments of the present disclosure. It should be noted that the complete transferring apparatus is not shown in FIG. 10, it further includes a plurality of micro clips that are not shown.

Referring to FIGS. 9 and 10, the series welding machine includes: a conveyor belt 220, an inspection apparatus (not shown), a welding mechanism, a strip-providing mechanism 230, a cutting mechanism 240, a strip-separating mechanism (not shown), and a transferring apparatus. The conveyor belt 220 is configured to carry a plurality of solar cells 100, such that an arrangement of the plurality of solar cells 101 is formed. The inspection apparatus is configured to perform inspections on the arrangement of the plurality of solar cells 101. The inspection apparatus includes a polarity inspection device configured to perform polarity inspections on the arrangement of the plurality of solar cells 101 and adjust the arrangement of the plurality of solar cells 101 in response to the polarity inspections not passing, until the polarity inspections on an adjusted arrangement of the plurality of solar cells 101 pass. The welding mechanism includes a welding table 210 (referring to FIG. 3) and is configured to weld the adjusted arrangement of the plurality of solar cells 101 with a set of welding strips 114. The strip-providing mechanism 230 is configured to provide a plurality of initial welding strips 111 arranged at intervals in a first direction X, each of the plurality of initial welding strips 111 extends in a second direction Y, the plurality of initial welding strips 111 include first initial welding strips and second initial welding strips, and the first initial welding strips interleave with the second initial welding strips in the first direction X. The cutting mechanism 240 is configured to cut each respective initial welding strip of the plurality of initial welding strips 111 along the first direction to obtain a plurality of welding strips 110. The cutting mechanism 240 includes a first cutting device 241 and a second cutting device 242. The first cutting device 241 is configured to cut each of the first initial welding strips 111 at one or more first cutting positions. The second cutting device 242 is configured to cut each of the second initial welding strips 111 at one or more second cutting positions that are offset from the one or more first cutting positions. The strip-separating mechanism is configured to move each welding strip of the plurality of welding strips 110 in the second direction Y to form the set of welding strips 114. The transferring apparatus is configured to transfer the set of welding strips 114 onto the adjusted arrangement of the plurality of solar cells 101, such that each welding strip 110 of the set of welding strips contacts with a peripheral solar cell 100 of the adjusted arrangement of the plurality of solar cells or with two respective adjacent solar cells 100 of the adjusted arrangement of the plurality of solar cells.

Referring to FIG. 9, the solar cells 100 may be arranged on the conveyor belt 220 to form the arrangement of the plurality of solar cells 101, and the inspection apparatus may be disposed over the conveyor belt 220. The arrangement of the plurality of solar cells 101 may be inspected using the inspection apparatus. The inspection apparatus may include a polarity inspection device and a visual inspection device, the visual inspection device is configured to perform visual inspections on the adjusted arrangement of the plurality of solar cells 101 and replace one or more solar cells whose visual inspections are not passed with new one or more solar cells in response to a visual inspection on any one solar cell of the adjusted arrangement of the plurality of solar cells 101 not passing, until the visual inspections on a replaced arrangement of the plurality of solar cells are passed. Each solar cell of the new one or more solar cells has a polarity same as a polarity of a respective solar cell of replaced one or more solar cells. When the polarity inspections by the polarity inspection device and the visual inspections by the visual inspection device all pass, the inspections performed on the arrangement of the plurality of solar cells are passed, and the replaced arrangement of the plurality of solar cells 101 is obtained.

In some embodiments, the conveyor belt 220 may be connected to the welding mechanism, such that the adjusted arrangement of the plurality of solar cells 101 on the conveyor belt 220 is conveyed to the welding table 210 of the welding mechanism by the conveyor belt 220 for the subsequent welding operation.

Referring to FIG. 10, the strip-providing mechanism 230 can form the plurality of initial welding strips 111 arranged at intervals in the first direction X and extending in the second direction Y. During forming the plurality of initial welding strips 111, the strip-providing mechanism 230 may move along the second direction Y, such that the plurality of initial welding strips 111 extending in the second direction Y are formed with moving of the strip-providing mechanism.

The cutting mechanism 240 may include a plurality of cutting knives disposed at different positions. It should be understood that the plurality of welding strips 110 in the cell string 102 are arranged in the interdigitated manner. In other words, in the first direction X, arrangement positions of the odd welding strips 110 are different from those of the even welding strips 110. Thus, the first cutting device 241 configured to cut each first initial welding strips 111 and the second cutting device 242 configured to cut each second initial welding strips 111 are provided, where the first cutting device 241 cut at one or more first cutting positions 112, and the second cutting device 242 cut at one or more second cutting positions 113 that are offset from the one or more first cutting positions 112. The one or more first cutting positions 112 and the one or more second cutting positions 113 may be set according to the arrangement of the plurality of welding strips in the cell string 102. One or more suitable first cutting positions 112 and one or more suitable second cutting positions 113 can reduce moving distance of the plurality of welding strips 110 during arrangement after cutting of the plurality of welding strips 110, thereby reducing the risk of the plurality of welding strips 110 being bent, and reducing the risk of deviation in welding of the plurality of welding strips 110 in the formed cell string 102.

The strip-separating mechanism can move the plurality of welding strips 110 obtained by cutting in the second direction Y. Due to the fact that during forming the plurality of initial welding strips 111 by the strip-providing mechanism 230, a distance between each two initial welding strips 111 in the first direction X is equal to a distance between each two welding strips 110 in the cell string 102 in the first direction X, there is no need for the plurality of welding strips 110 to be moved in the first direction X after cutting, thereby reducing the risk of the plurality of welding strips 110 being bent. Due to the fact that during cutting of the plurality of initial welding strips 111, the first initial welding strips 111 and the second initial welding strips 111 have different cutting position respectively, depending on the arrangement positions of the plurality of welding strips 110 in the cell string 102, moving distance of the plurality of welding strips 110 during a strip-separating process can be reduced, thereby further reducing the risk of the plurality of welding strips 110 being bent, and reducing the possibility of deviation in welding of the plurality of welding strips 110 in the cell string 102.

Figure 11:
FIG. 11 is a structural schematic diagram of the transferring apparatus of the series welding machine according to some embodiments of the present disclosure.

FIG. 11 is a structural schematic diagram of the micro clips of the series welding machine which clamp a welding strip for transferring according to some embodiments of the present disclosure.

Referring to FIGS. 10 and 11, in some embodiments, the transferring apparatus may include a plurality of micro clips 251 forming at least one set of micro clips 250. Micro clips 251 of one respective set of micro clips of the at least one set of micro clips are arranged in a line along the second direction Y. The plurality of micro clips 251 are configured to clamp the plurality of welding strips 110 for transferring the set of welding strips 114 onto the adjusted arrangement of the plurality of solar cells 101 by the transferring apparatus. During transferring the set of welding strips 114 onto the plurality of solar cells 100 by the transferring apparatus, the relative position relationship among the plurality of welding strips 110 of the set of welding strips 114 may be unchanged. When the plurality of micro clips 251 clamp the plurality of welding strips 110 for transferring, each micro clip 251 of the plurality of micro clips 251 may have a same moving trajectory.

Referring to FIG. 11, in some embodiments, during transferring the set of welding strips 114 onto the adjusted arrangement of the plurality of solar cells 101 by the transferring apparatus, each welding strip 110 of the set of welding strips are clamped and tensioned by at least two adjacent micro clips 251 of a respective set of micro clips 250 of the at least one set of micro clips. When the two micro clips 251 clamp a same welding strip 110, the two micro clips 251 are located in a same line along the second direction Y, and can tension the welding strip 110 in the second direction Y. In this way, the possible deformation of the welding strip 110 during the preceding strip-separating process can be reduced, thereby further reducing the risk of the welding strip 110 being bent, and reducing the possibility of deviation in welding of the welding strip 110 in the cell string 102.

Some embodiments of the present disclosure provide a series welding machine. The series welding machine includes a conveyor belt configured to carry the arrangement of the plurality of solar cells, an inspection apparatus configured to perform inspections on the arrangement of the plurality of solar cells, a welding mechanism configured to weld a plurality of solar cells with a plurality of welding strips, a strip-providing mechanism configured to provide a plurality of initial welding strips, a cutting mechanism configured to cut the plurality of initial welding strips to obtain the plurality of welding strips, a strip-separating mechanism configured to move the plurality of welding strips, and a transferring apparatus configured to transfer the set of welding strips onto the arrangement of the plurality of solar cells, where the cutting mechanism includes a first cutting device configured to cut at one or more first cutting positions and a second cutting device configured to cut at one or more second cutting positions that are offset from the one or more first cutting positions. In this way, all welding strips are processed concurrently, thereby improving production efficiency. On the other hand, different initial welding strips are cut at different cutting positions, strokes of the strip-separating mechanism can be reduced, thereby reducing the risk of the welding strips being bent and the possibility of deviations in welding. Moreover, inspections are performed on the arrangement of the plurality of solar cells using the inspection apparatus, thus the yield of products can be improved.

Those skilled in the art should understand that the above implement are specific embodiments of the present disclosure. In practical applications, various changes may be made in forms and details without departing from the spirit and scope of the present disclosure. Any person skilled in the art can make some possible changes and modifications without departing from the spirit and scope of the present disclosure. The scope of protection of the present disclosure shall be subject to the scope defined by the claims.

What is claimed is:

1. A method for welding a cell string, comprising:
providing a plurality of solar cells and forming an arrangement of the plurality of solar cells;
performing inspections on the arrangement of the plurality of solar cells, wherein the inspections include polarity inspections, wherein performing inspections on the arrangement of the plurality of solar cells includes, in response to determining that the arrangement of the plurality of solar cell does not pass the polarity inspections, adjusting the arrangement of the plurality of solar cells until the on an adjusted arrangement of the plurality of solar cells passing the polarity inspections;
in response to the adjusted arrangement of the plurality of solar cells passing the polarity inspections:
placing the adjusted arrangement of the plurality of solar cells on a welding table;
providing a plurality of initial welding strips arranged at intervals in a first direction, wherein each of the plurality of initial welding strips extends in a second direction, and wherein the plurality of initial welding strips include first initial welding strips and second initial welding strips, and the first initial welding strips interleave with the second initial welding strips in the first direction;
cutting each respective initial welding strip of the plurality of initial welding strips along the first direction to obtain a plurality of welding strips, wherein each of the first initial welding strips is cut at one or more first cutting positions, and each of the second initial welding strips is cut at one or more second cutting positions;
moving each welding strip of the plurality of welding strips in the second direction to form a set of welding strips having a spacing between each two adjacent welding strips of the plurality of welding strips in the second direction;
transferring the set of welding strips onto the adjusted arrangement of the plurality of solar cells such that each welding strip of the set of welding strips contacts with a peripheral solar cell of the adjusted arrangement of the plurality of solar cells or with two respective adjacent solar cells of the adjusted arrangement of the plurality of solar cells; and
welding each welding strip of the plurality of welding strips to the peripheral solar cell of the adjusted arrangement of the plurality of solar cells or to the two respective adjacent solar cells of the adjusted arrangement of the plurality of solar cells, to form a cell string;
wherein performing the polarity inspections on the arrangement of the plurality of solar cells further includes:
performing a polarity inspection on each respective solar cell of the arrangement of the plurality of solar cells;
in response to every two adjacent solar cells in the arrangement of the plurality of solar cells having a same polarity, determining that the arrangement of the plurality of solar cells does not pass the polarity inspections, and removing one solar cell of the two adjacent solar cells having the same polarity from the arrangement of the plurality of solar cells; and
in response to every two adjacent solar cells in the adjusted arrangement of the plurality of solar cells having different polarities, determining that the adjusted arrangement of the plurality of solar cells passes the polarity inspections.

2. The method according to claim 1, wherein the one or more second cutting positions are offset from the one or more first cutting positions in the second direction, and a distance between one respective first cutting position of the one or more first cutting positions and one respective second cutting position of the one or more second cutting positions adjacent to the one respective first cutting position in the second direction ranges from 50 mm to 110 mm.

3. The method according to claim 1, wherein the spacing between each two adjacent welding strips of the plurality of welding strips in the second direction ranges from 8 mm to 15 mm.

4. The method according to claim 1, wherein the inspections further include visual inspections, and in response to both the polarity inspections and the visual inspections passing, the inspections are passed;
performing the visual inspections on the arrangement of the plurality of solar cells, includes:
performing a visual inspection on each respective solar cell of the adjusted arrangement of the plurality of solar cells;
in response to the visual inspection of the each respective solar cell passing, determining that the visual inspections of the adjusted arrangement of the plurality of solar cells are passed;
in response to the visual inspection of any one solar cell of the adjusted arrangement of the plurality of solar cells not passing, determining that the visual inspections of the adjusted arrangement of the plurality of solar cells are not passed, and replacing one or more solar cells whose visual inspections are not passed with new one or more solar cells, wherein each solar cell of the new one or more solar cells has a polarity same as a polarity of a respective solar cell of replaced one or more solar cells; and
performing the visual inspections again, until the visual inspections on a replaced arrangement of the plurality of solar cells are passed.

5. The method according to claim 1, before transferring the set of welding strips onto the adjusted arrangement of the plurality of solar cells, further including:
providing a press tooling and placing the press tooling on the set of welding strips; and
transferring the set of welding strips onto the adjusted arrangement of the plurality of solar cells, further includes:
transferring the set of welding strips together with the press tooling onto the adjusted arrangement of the plurality of solar cells.

6. The method according to claim 1, during transferring the set of welding strips onto the adjusted arrangement of the plurality of solar cells, further includes:
clamping and tensioning each welding strip of the set of welding strips.

7. The method according to claim 1, wherein each first cutting position of the one or more first cutting positions aligns with a respective second cutting position of the one or more second cutting positions in the first direction.

8. The method according to claim 1, wherein the plurality of solar cells are a plurality of back-contact solar cells.

9. The method according to claim 8, wherein the plurality of back-contact solar cells are a plurality of interdigitated back-contact solar cell.

10. A series welding machine, comprising:
a conveyor belt, configured to carry a plurality of solar cells, such that an arrangement of the plurality of solar cells is formed;
an inspection apparatus, configured to perform inspections on the arrangement of the plurality of solar cells, wherein the inspection apparatus includes a polarity inspection device configured to perform polarity inspections on the arrangement of the plurality of solar cells and adjust the arrangement of the plurality of solar cells in response to the polarity inspections not passing, until the polarity inspections on an adjusted arrangement of the plurality of solar cells pass;

a welding mechanism, including a welding table and configured to weld the adjusted arrangement of the plurality of solar cells with a set of welding strips;

a strip-providing mechanism, configured to provide a plurality of initial welding strips arranged at intervals in a first direction, wherein each of the plurality of initial welding strips extends in a second direction, and wherein the plurality of initial welding strips include first initial welding strips and second initial welding strips, and the first initial welding strips interleave with the second initial welding strips in the first direction;

a cutting mechanism, configured to cut each respective initial welding strip of the plurality of initial welding strips along the first direction to obtain a plurality of welding strips, wherein the cutting mechanism includes:
  a first cutting device, configured to cut each of the first initial welding strips at one or more first cutting positions; and
  a second cutting device, configured to cut each of the second initial welding strips at one or more second cutting positions;

a strip-separating mechanism, configured to move each welding strip of the plurality of welding strips in the second direction to form the set of welding strips having a spacing between each two adjacent welding strips of the plurality of welding strips in the second direction; and a transferring apparatus, configured to transfer the set of welding strips onto the adjusted arrangement of the plurality of solar cells, such that each welding strip of the set of welding strips contacts with a peripheral solar cell of the adjusted arrangement of the plurality of solar cells or with two respective adjacent solar cells of the adjusted arrangement of the plurality of solar cells;

wherein the polarity inspection device is configured to:

perform a polarity inspection on each respective solar cell of the arrangement of the plurality of solar cells;

in response to every two adjacent solar cells in the arrangement of the plurality of solar cells having a same polarity, determine that the arrangement of the plurality of solar cells does not pass the polarity inspections, and remove one solar cell of the two adjacent solar cells having the same polarity from the arrangement of the plurality of solar cells; and in response to every two adjacent solar cells in the adjusted arrangement of the plurality of solar cells having different polarities, determine that the adjusted arrangement of the plurality of solar cells passes the polarity inspections.

11. The series welding machine according to claim 10, wherein the one or more second cutting positions are offset from the one or more first cutting positions in the second direction, and a distance between one respective first cutting position of the one or more first cutting positions and one respective second cutting position of the one or more second cutting positions adjacent to the one respective first cutting position in the second direction ranges from 50 mm to 110 mm.

12. The series welding machine according to claim 10, wherein the spacing between each two adjacent welding strips of the plurality of welding strips in the second direction ranges from 8 mm to 15 mm.

13. The series welding machine according to claim 10, wherein the inspection apparatus further includes a visual inspection device configured to perform visual inspections on the adjusted arrangement of the plurality of solar cells and replace one or more solar cells whose visual inspections are not passed with new one or more solar cells in response to a visual inspection on any one solar cell of the adjusted arrangement of the plurality of solar cells not passing, until the visual inspections on a replaced arrangement of the plurality of solar cells are passed, wherein each solar cell of the new one or more solar cells has a polarity same as a polarity of a respective solar cell of replaced one or more solar cells.

14. The series welding machine according to claim 10, wherein each first cutting position of the one or more first cutting positions aligns with a respective second cutting position of the one or more second cutting positions in the first direction.

15. The series welding machine according to claim 10, wherein the transferring apparatus includes:
  a plurality of micro clips forming at least one set of micro clips, wherein micro clips of one respective set of micro clips of the at least one set of micro clips are arranged in a line along the second direction, and the plurality of micro clips are configured to clamp the plurality of welding strips for transferring the set of welding strips onto the adjusted arrangement of the plurality of solar cells.

16. The series welding machine according to claim 15, wherein during transferring the set of welding strips onto the adjusted arrangement of the plurality of solar cells by the transferring apparatus, each welding strip of the set of welding strips are clamped and tensioned by at least two adjacent micro clips of a respective set of micro clips of the at least one set of micro clips.

17. The series welding machine according to claim 10, wherein the inspection apparatus is disposed over the conveyor belt.

18. The series welding machine according to claim 10, wherein the conveyor belt is connected to the welding mechanism, and the adjusted arrangement of the plurality of solar cells is conveyed to the welding table by the conveyor belt.

19. The series welding machine according to claim 10, wherein the plurality of solar cells are a plurality of interdigitated back-contact solar cell.

* * * * *